United States Patent
Gump et al.

(10) Patent No.: US 12,221,519 B2
(45) Date of Patent: Feb. 11, 2025

(54) HYDROPHOBIC COATINGS ON GLASS HAVING SUPERIOR PROPERTIES AND METHODS OF COATING USING ATOMIC OR MOLECULAR DEPOSITION

(71) Applicant: ALD Nanosolutions, Inc., Broomfield, CO (US)

(72) Inventors: Chris Gump, Broomfield, CO (US); Daniel Higgs, Broomfield, CO (US); Markus Groner, Broomfield, CO (US); Robert Hall, Broomfield, CO (US)

(73) Assignee: ALD Nanosolutions, Inc.

( * ) Notice: Subject to any disclaimer, the term of this patent is extended or adjusted under 35 U.S.C. 154(b) by 1127 days.

(21) Appl. No.: 17/046,282

(22) PCT Filed: Apr. 9, 2019

(86) PCT No.: PCT/US2019/026652
§ 371 (c)(1),
(2) Date: Oct. 8, 2020

(87) PCT Pub. No.: WO2019/199879
PCT Pub. Date: Oct. 17, 2019

(65) Prior Publication Data
US 2021/0163348 A1     Jun. 3, 2021

Related U.S. Application Data

(60) Provisional application No. 62/783,126, filed on Dec. 20, 2018, provisional application No. 62/742,911,
(Continued)

(51) Int. Cl.
*C08J 7/043* (2020.01)
*C03C 17/00* (2006.01)
(Continued)

(52) U.S. Cl.
CPC ............. *C08J 7/043* (2020.01); *C03C 17/001* (2013.01); *C03C 17/38* (2013.01); *C08J 7/046* (2020.01);
(Continued)

(58) Field of Classification Search
CPC ......... B28B 11/04; B28B 7/36; B28B 11/049; B05D 7/00; B05D 7/51; B05D 2401/10;
(Continued)

(56) References Cited

U.S. PATENT DOCUMENTS 7,553,686 B2    6/2009    George et al.
8,071,255 B2    12/2011    Schlenoff
(Continued)

OTHER PUBLICATIONS

First Office Action in Chinese Application No. 201980033029.0A dated Dec. 22, 2021.
(Continued)

*Primary Examiner* — Camie S Thompson
(74) *Attorney, Agent, or Firm* — Frank Rosenberg

(57) ABSTRACT

The invention provides substrates coated with a hydrocarbon or fluorocarbon layer. The coated substrate has superior properties such as improved hydrophobicity and/or oleophobicity. Also disclosed are methods of making coatings on substrates using atomic layer deposition (ALD) and/or molecular layer deposition (MLD).

20 Claims, 1 Drawing Sheet

Related U.S. Application Data filed on Oct. 8, 2018, provisional application No. 62/655,171, filed on Apr. 9, 2018.

(51) Int. Cl.
*C03C 17/38* (2006.01)
*C08J 7/046* (2020.01)
*C08J 7/056* (2020.01)

(52) U.S. Cl.
CPC ......... *C08J 7/056* (2020.01); *C03C 2217/214* (2013.01); *C03C 2217/425* (2013.01); *C03C 2217/76* (2013.01); *C03C 2218/152* (2013.01); *C03C 2218/32* (2013.01)

(58) Field of Classification Search
CPC ..... C03C 17/28; C03C 17/2405; C03C 17/42; C03C 2217/76; C03C 2217/944; C08J 7/04; C08J 7/12; C09D 5/00; C09D 7/63; C09D 7/80; C09D 201/02; C09D 201/04; C23C 16/44; C23C 22/34; C23C 14/228; C23C 16/40; C23C 16/45525; C23C 22/77; C23C 22/83; B01J 20/3285; B32B 27/28; B32B 2255/28; B32B 2260/02; B32B 2307/73

See application file for complete search history.

(56) References Cited

U.S. PATENT DOCUMENTS

| | | | |
|---|---|---|---|
| 8,221,870 | B2 | 7/2012 | Brown |
| 8,277,899 | B2 | 10/2012 | Krogman et al. |
| 8,293,658 | B2 | 10/2012 | Shero et al. |
| 8,455,672 | B2 | 6/2013 | Gordon et al. |
| 8,501,277 | B2 | 8/2013 | Kobrin et al. |
| 8,753,744 | B2 | 6/2014 | Borrelli et al. |
| 9,090,971 | B2 | 7/2015 | Weimer et al. |
| 2018/0223127 | A1 | 8/2018 | Cho et al. |

OTHER PUBLICATIONS

Translation of First Office Action in Chinese Application No. 201980033029.0A dated Dec. 22, 2021.
International Preliminary Report on Patentability from International Application No. PCT/US2019/026652 issued Oct. 13, 2020.
International Search Report and Written Opinion from International Application No. PCT/US2019/026652 mailed Aug. 7, 2019.
Yong et al, Superoleophobic Surfaces, Chem. Soc. Rev. 2017, 46, 4168-4217.
George, Steven, "Atomic Layer Deposition: An Overview," Chem. Rev. 110:111-131 (2010).
Klaus et al, "Atomic Layer Controlled Growth of SiO2 Files Using Binary Reaction Sequence Chemistry," Appl. Phys. Lett. 70, 1092 (1997).
Sneh et al, "Atomic Layer Growth of SiO2 on Si(100) and H2O using a Binary Reaction Sequence," Surface Science 334, 135 (1995).
Dillon et al, "Surface Chemistry of Al2O3 Deposition using Al(CH3)3 and H2O in a Binary reaction Sequence," Surface Science 322, 230 (1995).
Ott et al, "Al2O3 Thin Film Growth on Si(100) Using Binary Reaction Sequence Chemistry," Thin Solid Films 292, 135 (1997).
Tsapatsis et al, "Synthesis of Hydrogen Permselective SiO2, TiO2, Al2O3, and B2O3 Membranes from the Chloride Precursors," Ind. Eng. Chem. Res. 30:2152-2159 (1991).
Lin et al, "CVD of Solid Oxides in Porous Substrates for Ceramic Membrane Modification," AlChE Journal 38:445-454 (1992).
George et al, "Metalcones: Hybrid Organic-Inorganic Films Fabricate Using Atomic and Molecular Layer Deposition Techniques," J. Nanosci. Nanotechnol. 11, 1-8 (2011).
Herrmann et al, "Conformal Hydrophobic Coatings Prepared Using Atomic Layer Deposition Seed Layers and Non-Chlorinated Hydrophobic Precursors," J. Micromech. Microeng. 15, 1-9 (2005).
Fug et al, "Molecular Layer Deposition of Polyurethane-Polymerization at the Very Contact to Native Aluminum and Copper," Applied Surface Science 426, 133-147 (2017).
Lee et al, "Mechanisms for Hydrophilic/Hydrophobic Wetting Transitions on Cellulose Cotton Fibers Coated Using Al2O3 Atomic Layer Deposition," Journal of Vacuum Science & Technology A: Vacuum, Surface, and Films 30, 01A163 (2012).
Liang et al, Ultra-Thin Microporous-Mesoporous Metal Oxide Films Prepared by Molecular Layer Deposition (MLD), Chem. Commun., 7140-7142 (2009).
Liang et al, "Ultrathin Highly Porous Alumina Films Prepared by Alucone ABC Molecular Layer Deposition (MLD)," Microporous and Mesoporous Materials 168:178-182 (2013).
Teisala et al, "Superhydrophobic Coatings on Cellulose-Based Materials: Fabrication, Properties, and Applications," Adv. Mater. Interfaces 1:1-20 (2014).
Meng, Xiangbo, "An Overview of Molecular Layer Deposition for Organic and Organic-Inorganic Hybrid Materials: Mechanisms, Growth Characteristics, and Promising Applications," J. Mater. Chem. A 5:18326 (2017).
Finch et al, "Biocompatibility of Atomic Layer-Deposited Alumina Thin Films," J. Biomed. Mater. Res. A 87:100-6 (2007).
Sundberg et al, "Organic and Inorganic-Organic Thin Film Structures by Molecular Layer Deposition: A Review," Beilstein J. Nanotechnol., 5:1104-1136 (2014).
Exfluor Research Corp. Glass Fluorinated Products: Esters screen capture. https://exfluor.com/collections/esters.

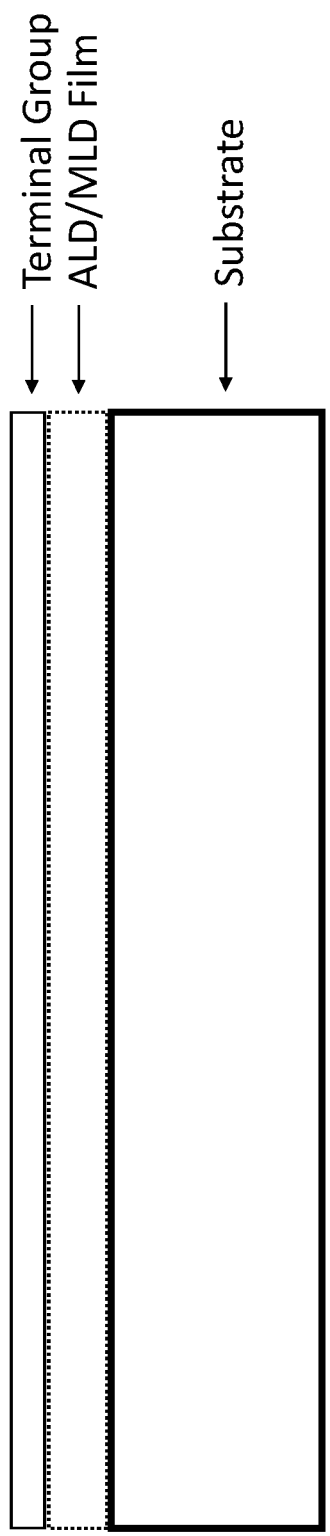

HYDROPHOBIC COATINGS ON GLASS HAVING SUPERIOR PROPERTIES AND METHODS OF COATING USING ATOMIC OR MOLECULAR DEPOSITION

RELATED APPLICATIONS

This application is a national stage filing of PCT/US2019/026652 and claims priority of U.S. Provisional Patent Applications Ser. Nos. 62/655,171 filed 9 Apr. 2018; 62/742,911 filed 8 Oct. 2018; and 62/783,126 filed 20 Dec. 2018 which are incorporated herein as if reproduced in full below.

SUMMARY OF THE INVENTION

In one aspect, the invention provides a method of making a coated substrate, comprising: providing a substrate; exposing the substrate to a reactant A; removing any excess reactant A, leaving a surface modified by reactant A; subsequent to the step of removing, exposing the substrate to a reactant B that bonds to the surface modified by reactant A; wherein reactant B comprises a hydrocarbon or fluorocarbon moiety; removing any excess reactant B; wherein the steps of exposing the substrate to reactant A through to the step of removing any excess reactant B constitutes one cycle; conducting 2 to 100, preferably 5 to 100 cycles to form a coated substrate; and subsequent to the cycles, reacting the coated substrate with a hydrophobic, preferably fluorinated, terminal group.

In some preferred embodiments, the invention is further characterized by one, or any combination, of the following features: wherein the substrate has a microstructured surface; further comprising reacting a surface of the substrate with a surface initiation agent prior to the step of exposing the substrate to a reactant A; further comprising, subsequent to the step of removing any excess reactant B, exposing the substrate to a reactant C that bonds to the surface modified by reactant B; wherein reactant C comprises a hydrocarbon or fluorocarbon moiety; wherein Reactant A comprises a diisocyanate, a diacrylate, or a dicarboxylic acid, and Reactant B comprises a diol, an amine alcohol, or a diamine; wherein the reaction of Reactant A with Reactant B comprises: isocyanate with alcohol, isocyanate with amine, amine-acrylate-ester with epoxy, metal chloride with alcohol, anhydride with amine, amine with acyl chloride, alcohol with acyl chloride, or alkene with thiol; wherein Reactant A comprises a metal chloride, dialkylzinc, metal alkoxide, metal alkyl (including straight or branched alkyl and complex (e.g., cyclopentadienyl compound), metal acetate, metal carboxylate, and metal carbonyl, and combinations thereof; wherein the substrate comprises a glass plate and the reaction of Reactant A and Reactant B comprises a mass gain per cycle of 10-500 ng/cm$^2$ or 10-300 ng/cm$^2$; wherein Reactant A comprises a diisocyanate and Reactant B comprises a diamine, and a polyurea is formed on the surface of the substrate; wherein the terminating group comprises an amine that reacts with an isocyanate; wherein, prior to exposing the substrate to Reactant A, the surface of the substrate is activated by reacting with an amino-alkoxy-silane.

In another aspect, the invention provides a method of making a substrate coated with a hydrophobic and/or oleophobic layer or layers, comprising: providing a substrate comprising a surface comprising a metal oxide and surface hydroxyls or other chemical functional groups; reacting the substrate with a first reactant (Reactant A) following by reaction with a second reactant (Reactant B) in a process of molecular layer deposition (MLD) in a sequential manner to produce a MLD layer having alternating, bonded Reactant A moieties and Reactant B moieties; and reacting the MLD layer with a hydrophobic terminating agent. Preferably, the method further comprises forming a layer comprising porous aluminum oxide and/or any of the other process steps mentioned herein.

In preferred embodiments, the method may further be characterized by one or any combination of: wherein the substrate comprises a surface comprising a metal oxide and surface hydroxyls or other chemical functional group is made by a step comprising etching the surface of a glass plate; the glass plate could also have metal oxide layer(s), or hybrid organic-inorganic layer(s) that are etched prior to MLD to form the hydrophobic coating; etching can be conducted, for example, by submerging in liquid water, exposure to ozone, exposure to temperatures from 300° C. to 1300° C. in an oxygen-containing environment or an oxygen-free environment, or in the presence of steam, plasma etching; forming a porous aluminum oxide layer between the glass substrate and the MLD layer; wherein the MLD layer is made by at least 2 cycles of reaction with a first reactant (Reactant A) and a second reactant (Reactant B); wherein an MLD cycle is typically conducted by reacting with a gaseous Reactant A, evacuating to remove excess Reactant A, subsequently reacting a gaseous Reactant B, and evacuating to remove excess Reactant B.

In another aspect, the invention provides a method of making a coated glass, comprising: providing a glass substrate; exposing the glass substrate to trimethylaluminum; removing any excess trimethylaluminum; subsequent to the step of removing, exposing the glass substrate to a fluorinated diol; removing any excess fluorinated diol; wherein the steps of exposing the glass substrate to trimethylaluminum through to the step of removing any excess fluorinated diol constitutes one cycle; conducting 5 to 100 cycles to form a coated glass substrate; and subsequent to the cycles, reacting the coated glass substrate with a hydrophobic, preferably fluorinated, terminal group. In preferred embodiments, the method may further be characterized by one or any combination of: further comprising a step of reacting the coated glass substrate with trimethylaluminum prior to the step of reacting with a fluorinated terminating group; wherein the fluorinated diol comprises 1H,1H,6H,6H-perfluoro-1,6-hexanediol or 1H,1H,5H,5H-perfluoro-1,6-pentanediol; wherein the terminating group comprises 2,2,3,3,4,4,5,5,6,6,7,7,8,8, -pentadecafluoro-1-octanol; wherein the fluorinated hydrocarbon moiety comprises a moiety derived from 1H,1H,6H,6H-perfluoro-1,6-hexanediol; and/or wherein the fluorinated terminating group comprises a moiety derived from 2,2,3,3,4,4,5,5,6,6,7,7,8,8, -pentadecafluoro-1-octanol.

The invention also includes a coated substrate made by any of the methods described herein.

The invention further provides an article having a hydrophobic exterior surface, comprising: a substrate comprising a surface comprising a metal oxide or metal nitride; a hydrophobic, terminating layer on the exterior surface; and an intervening layer disposed between the substrate surface and the terminating layer; wherein the intervening layer comprises covalently-bonded chains wherein each chain comprises at least one, preferably at least two cycles of reacting at least two reactants (Reactant A and Reactant B). In some embodiments, the article comprises a porous aluminum oxide layer disposed between the substrate surface and the intervening layer.

In another aspect, the invention provides a coated substrate, comprising: a substrate; 2 to 100 alternating layers of metal oxide and a hydrocarbon or fluorocarbon moiety disposed on the glass substrate; and a hydrophobic, preferably fluorinated, terminating group; wherein the alternating layers are interposed between the glass substrate and the hydrophobic terminating group. In preferred embodiments, the coated substrate may further be characterized by one or any combination of: wherein the metal in the metal oxide is selected from the group consisting of Al, Zn, Zr, and Ti, and combinations thereof; further comprising a porous metal oxide layer having a thickness in the range of 1 to 500 nm disposed between the substrate and the 2 to 100 alternating layers of metal oxide and a hydrocarbon or fluorocarbon moiety; wherein the hydrocarbon or fluorocarbon moiety has carbon chain lengths that are substantially perpendicular to the substrate surface; having an optical transparency of at least 90% over the visible spectrum and wherein the surface exhibits a water contact angle of 100°; having one or any combination of the following properties: the films comprise less than 10 mass % or less than 5 mass %, or less than 1 mass % transition metals in the outer (surface) 2 nm or 5 nm or 10 nm of film thickness; visible transmittance of at least 90% at all points in the visible spectrum; water contact angle of at least 100°, or at least 105°, or at least 110°, or at least 120°, a haze of 0.5% or 0.3%, or 0.2% or less; a water sliding angle of 15° or less, or 10° or less; the entire coating having thickness of 100 nm or less from the substrate surface to the exterior of the terminating layer; with each sublayer having a thickness of at least 0.2 nm or at least 0.5 nm and up to about 20 nm; an optical clarity of at least 80% or at least 90% over the visible spectrum from 400 to 700 nm; specified layer thicknesses for example a coating thickness in the range of 0.5 to 200 nm, or 1 to 100 nm, or 1 to 50 nm, or 0.5 to 20 nm; a porous layer comprising aluminum oxide disposed between the glass substrate and the hydrophobic layer; wherein the film on the top surface is characterizable by a high shear strength having the best score on a 0 to 5 scale as measured according to ASTM D3359; birefringence or other anisotropic interaction with polarizable light that shows higher order structure or x-ray reflectivity (XRR) that shows higher order structure; at least 5 or at least 10 or at least 20 mass % F in the top (surface) 1 nm or top 5 nm or top 10 nm of film, and/or having a F/O atomic ratio of at least 2 or at least 5 or at least 10 or at least 20 in the top (surface) 1 nm or top 5 nm or top 10 nm of film; at least 5 or at least 10 or at least 20 mass % C in the top (surface) 1 nm or top 5 nm or top 10 nm of film, and/or having a C/O atomic ratio of at least 2 or at least 5 or at least 10 or at least 20 in the top (surface) 1 nm or top 5 nm or top 10 nm of film; a haze of 5% or less, preferably 2%, 1%, or 0.5% or less after exposure to 100% humidity in air at standard temperature and pressure; and/or an olephobicity contact angle (analogous to water contact angle but measured with ethylene glycol) of at least 100°, more preferably at least 120°, and still more preferably at least 160°.

While some aspects of the invention are described based on chemical knowledge; the invention may alternatively be described according to physical properties and this is a necessary and important way to describe some aspects of the invention, especially since specific chemical structures cannot be known with certainty in every instance.

In another aspect, the invention provides an article having a hydrophobic surface, comprising: a substrate comprising a hydrophobic surface film wherein the film on the top (exterior) surface is characterizable by at least two of the following four characteristics: a high shear strength having the best score on a 0 to 5 scale as measured according to ASTM D3359; a water contact angle of at least 110°; at least two different types of alternating, carbon-based moieties in a chain having a pattern of ABAB; and birefringence or other anisotropic interaction with polarizable light (for example, polarized soft x-rays (see e.g., Polarized X-ray Scattering Reveals Non-Crystalline Orientational Ordering in Organic Films," Nature Materials, April 2012); or x-ray diffraction (XRD) that shows higher order structure or x-ray reflectivity (XRR) that shows higher order structure). This hydrophobic coated glass may be further characterized or alternately characterized by any of the other characteristics mentioned herein.

In preferred embodiments, the article may further be characterized by one or any combination of: wherein the film on the top surface is characterizable by: a high shear strength having the best score on a 0 to 5 scale as measured according to ASTM D3359; and a water contact angle of at least 120°; wherein the film on the top surface is characterizable by the presence of alternating, carbon-based moieties in a chain having a pattern of ABAB; and birefringence or other anisotropic interaction with polarizable light or x-ray diffraction (XRD) that shows higher order structure or x-ray reflectivity (XRR) that shows higher order structure; wherein the film on the top surface is characterizable by a high shear strength having the best score on a 0 to 5 scale as measured according to ASTM D3359; a water contact angle of at least 120°; and birefringence or other anisotropic interaction with polarizable light or x-ray diffraction (XRD) that shows higher order structure or x-ray reflectivity (XRR) that shows higher order structure; wherein the film on the top surface is characterizable by a high shear strength having the best score on a 0 to 5 scale as measured according to ASTM D3359; a water contact angle of at least 110°; and at least two different types of alternating, carbon-based moieties in chain having a pattern of ABAB; wherein the film on the top surface is characterizable by a water contact angle of at least 120°; wherein the hydrophobic coated substrate is in an outdoor display; portable instrument display, vehicular display, window, lamp cover, sporting equipment, indoor touch display, indoor console display, portable medical display, outdoor CCD camera window, lense, outdoor detector cover glass, or lab instrument panel; wherein the substrate is a glass plate; wherein the glass is an aluminum silicate, borosilicate, or soda lime glass; wherein the substrate is a powder; wherein the substrate has a microstructured surface; further comprising a porous metal layer having a thickness in the range of 1 to 500 nm disposed between the substrate and the film on the top surface; wherein the surface film comprises carbon chains having chain lengths substantially perpendicular to the substrate surface; wherein the film on the top surface comprises at least two types of carbon-based moieties in a chain that comprise polyurethanes, polyacrylates, polysiloxanes, polyesters, polyamides, polythioureas, polyimides, and polyamide-polyamides; wherein the surface film has a F/H atomic ratio of at least 1; wherein the surface film is characterizable by a XRR spectrum that comprise Kiessig fringes that indicate a super lattice structure; and/or having one or any combination of the following properties: the films comprise less than 10 mass % or less than 5 mass %, or less than 1 mass % transition metals in the outer (surface) 2 nm or 5 nm or 10 nm of film thickness; visible transmittance of at least 90% at all points in the visible spectrum; water contact angle of at least 100°, or at least 105°, or at least 110°, or at least 120°, a haze of 0.5% or 0.3%, or 0.2% or less; a water sliding angle of 15° or less, or 10° or less; the entire coating having thickness of 100 nm or less from the substrate surface to the exterior of the terminating layer; with each sublayer having a thickness of at least 0.2 nm or at least 0.5 nm and up to about 20 nm; an optical clarity of at least 80% or at least 90% over the visible spectrum from 400 nm to 700 nm; specified layer thicknesses for example a coating thickness in the range of 0.5 nm to 200 nm, or 1 nm to 100 nm, or 1 nm to 50 nm, or 0.5 nm to 20 nm; a porous layer comprising aluminum oxide disposed between the glass substrate and the hydrophobic layer; wherein the film on the top surface is characterizable by a high shear strength having the best score on a 0 to 5 scale as measured according to ASTM D3359; birefringence or other anisotropic interaction with polarizable light that shows higher order structure or x-ray reflectivity (XRR) that shows higher order structure; at least 5 or at least 10 or at least 20 mass % F in the top (surface) 1 nm or top 5 nm or top 10 nm of film, and/or having a F/O atomic ratio of at least 2 or at least 5 or at least 10 or at least 20 in the top (surface) 1 nm or top 5 nm or top 10 nm of film; at least 5 or at least 10 or at least 20 mass % C in the top (surface) 1 nm or top 5 nm or top 10 nm of film, and/or having a C/O atomic ratio of at least 2 or at least 5 or at least 10 or at least 20 in the top (surface) 1 nm or top 5 nm or top 10 nm of film; a haze of 5% or less, preferably 2%, 1%, or 0.5% or less after exposure to 100% humidity in air at standard temperature and pressure; and/or an olephobicity contact angle (analogous to water contact angle but measured with ethylene glycol) of at least 100°, more preferably at least 120°, and still more preferably at least 160°.

In any of the articles described herein, there may be a lanthanide oxide layer in the coating, preferably formed by ALD and disposed between the substrate and an ALD or MLD layer. In one aspect, the invention provides an article having a hydrophobic exterior surface, comprising: a substrate comprising a surface comprising a metal oxide or metal nitride; a lanthanide oxide layer disposed on the surface; and a hydrophobic terminating group disposed over the lanthanide oxide layer and disposed on the exterior of the article. A lanthanide oxide layer comprises at least 50 mass % lanthanide atoms, and most preferably comprises essentially $La_2O_3$. The terminating group may be any of the terminating groups discussed herein and the substrate may be any of the substrates discussed herein. The article having a lanthanide oxide layer may have any of the features described herein.

In a related aspect, the invention also provides a method of making an article comprising a hydrophobic coating, comprising: depositing a lanthanide oxide coating on the surface of a substrate wherein the substrate's surface comprises a surface comprising a metal oxide or metal nitride; wherein the lanthanide oxide coating is formed by ALD; and reacting the lanthanide oxide coating with a terminating agent. In some preferred embodiments, the lanthanide oxide coating which is deposited by ALD, is subsequently subjected to a heat treatment at a temperature of at least 500° C., preferably in the range of 600 to 900° C. in the absence of oxygen gas. Preferably, subsequent to heat treatment, the lanthanide oxide coating is exposed to an oxygen-containing gas such as air. The treatment forms a hydrophobic lanthanide oxide layer.

The statement that a coating comprises a pattern ABAB includes optional additional moieties such as an ABCABC pattern. The presence of these moieties can be identified by FTIR, $^1H$, $^{13}C$, $^{19}F$, $^{29}Si$ NMR, including techniques such as NMR INADEQUATE (Incredible Natural Abundance Double Quantum Transfer Experiment), laser ablation mass spectroscopy, low energy ion scattering (LEIS), and atom probe tomography.

In a further aspect, the invention includes a substrate comprising a hydrophilic coating, wherein the hydrophilic coating comprises a lanthanide oxide made by the stepwise ALD or MLD technique. For example, this hydrophilic film is created by ALD from alternating treatments of yttrium tris (N,N'-diisopropylacetaminidinate) and water at 250° C. Generally, the method comprises reaction of a substrate surface with a lanthanide complex, removal of excess lanthanide complex reactant from the reaction chamber, then reaction with water or other suitable oxidizing agent, and again removing excess oxidizing agent. This ALD process results in a unique film composition that is unavailable by other synthetic techniques, even after an optional heat treatment and/or exposure to air to obtain a hydrophobic lanthanide oxide film. In particular, the ALD process produces lanthanide oxide coated surfaces with suitable hydrophobic nature while adding the minimal amount of material. This is particularly important for optical applications, where every added layer of atoms can reduce the amount and clarity of light transmitting through the substrate. Substrates that cannot withstand the heat conditions during synthesis should be avoided. Porous layers may be produced analogous to the porous alumina layer described herein. This aspect of the invention includes the intermediate composition, the synthetic method and the final product after optional heat treatment.

Another embodiment of the invention comprises a substrate coated with a lanthanum group (that is, lanthanide) oxide by ALD that may be optionally heat treated and further exposed to a capping layer. The benefit of this approach over alumina (or similar) coating with a capping group is that the lanthanum group oxide is itself hydrophobic after optional post-treatments such as thermal treatment and/or exposure to air for more than approximately 5-50 hours whereas the aluminum oxide is hydrophilic so would not provide subsurface hydrophobicity.

The invention is often characterized by the term "comprising" which means "including," and does not exclude additional components. For example, a method comprising reaction with a Reactant A and a Reactant B does not exclude the possibility of the presence of an additional Reactant C. In narrower aspects, the term "comprising" may be replaced by the more restrictive terms "consisting essentially of" or "consisting of" in any of the descriptions of the invention.

The inventive articles may have a variety of applications such as outdoor displays; portable instrument displays (e.g., cell phones, augmented reality devices, virtual reality devices), vehicular displays, windows, lamp covers, sporting equipment, indoor touch displays, indoor console displays, portable medical displays, outdoor CCD camera windows, lenses such as eyeglass lenses or contact lenses, telescopic lenses, etc., outdoor detector cover glass, or lab instrument panels. Advantages may include: the ability to shed moisture, water repellency, enhanced cleanability such as cleaning fingerprints or traffic dirt, oleo/lubricant resistant, interfacial bonding/adhesion, scratch resistance, transparency, and/or low haze.

BRIEF DESCRIPTION OF THE DRAWING

FIG. 1 is a cross-sectional schematic drawing of a coated substrate according to the invention.

DETAILED DESCRIPTION OF THE INVENTION

Substrate

The inventive method typically begins with a substrate comprising a polymer, semimetal, metal, metal oxide or metal nitride at the surface. The metal oxide is preferably a glass that possesses surface hydroxyls or is modified to possess surface hydroxyls. Typically, the glass will comprise a silica matrix along with other elements. A preferred glass is an aluminum silicate. Other glasses can be used; for example, borosilicate, soda lime glass. Any of these glasses are often surface treated with an alkali metal or metals (and/or alkaline earth metal or metals) that strengthen the glass. Some common trade names that can be employed as the substrate include Corning Gorilla™ glass, and Pyrex™. Other trade names include: Abrisa Technologies Clean Vue™ PRO-AR399, (SCHOTT Borofloat®, SCHOTT D263®, BK-7) High Ion-exchange (HIE™) glass, SCHOTT Xensation™, AGC Dragontrail™, soda lime glass, fused silica, and low or non-alkaline glass (Corning® Eagle XG® or SCHOTT AF32®).

Some preferred metals comprise metal parts or powders, e.g., NiTi (Nitinol), Al, Al6061, AlMg10Si, Ti-64, 316L steel. Some preferred polymers comprise polyester, polythioether, polyamides, polyurethane, polyurea, polycarbonate, polypropylene, polystyrene, PMMA, or PDOT:PSS.

In some preferred cases, the polymer, semimetal, metal, metal oxide or metal nitride is subjected to a treatment to enhance surface reactivity for subsequent reaction. This treatment may be, for example, acid etching, plasma oxidation, or ALD surface treatment etc.

The substrate may comprise particles that can be treated by ALD or MLD in a fluidized bed. Some preferred embodiments, powders comprise silica, or a refractory material such as aluminum nitride (AlN) or a boron carbide (such as $B_4C$). Polymer powders e.g., polyester, polythioether, polyamide, polyeurethane, polyurea, polycarbonate, polypropylene, polystyrene, PMMA, or PDOT:PSS etc.

The substrate may alternatively be a flat or curved plate of any dimension. In some embodiments, the plate has a thickness of 0.1 mm to 20 mm, in some embodiments 10 mm or less; in some embodiments, a height and a width of at least 1 cm or at least 5 cm in each dimension.

The substrate may be a patterned, or microtextured substrate. So-called superoleophobic structured surfaces have been reported (see Yong, Superoleophobic Surfaces, Chem. Soc. Rev. 2017, 46, 4168-4217). The present invention includes these surfaces patterned with re-entrant structures (such as inverted trapezoid surface microstructures) and coated with any of the films described herein. The structure may have a surface comprising: electrospun fibers, regular micro-hoodoo surface, micropillars with wavy side walls, T-shaped overhang structures, micronails, microscale posts with nanoscale vertical overhangs, and microscopic rough wire meshes. Films according to the present invention are covalently bonded to these structures and form uniform coatings over all the exposed surfaces (not merely line-of-sight coatings). For transparency, it is desirable for the microscale features to have dimensions of less than 300 nm.

Optional Surface Initiation

After the optional step of a surface treatment to increase surface reactivity, the surface can be treated with an initiating agent to form a surface layer of compounds that are bound at one end to the substrate and a reactive group at the other end for subsequent reaction by ALD or MLD. The surface initiation agent must be capable of reacting with substrate surface (typically after surface treatment of the substrate). The reactive group may be, for example, any of the reactive groups mentioned in the section below regarding reactants.

Specific examples of surface initiation agents, include: trimethylaluminum, 2,2-dimethoxy-1,6-diaza-2-silacycloctane, (N,N-dimethylaminopropyl)-aza-2-methyl-2-methoxysilacyclopentane, N-methyl-aza-2,2,4-trimethylsilacyclopentane, N-ethyl-2,2-dimethoxy-4-methyl-1-aza-2-silacyclopentane, N-(2-aminoethyl)-2,2,4-trimethyl-1-aza-2-silacyclopentane.

Since hydrophobicity and, in many cases, oleophobicity, is desired, the $CH_2$ moieties may be substituted by $CF_2$ moieties; and this substitution may be carried out with any of the compounds described herein. Conversely, where less oleophobicity is desired, $CF_2$ moieties may be replaced by $CH_2$ moieties.

Formation of Optional Porous Alumina Layer

Trimethylaluminum (TMA) can be reacted with water in a stepwise fashion by the well-known ALD process to create an aluminum-oxo-containing layer (aluminum with oxygens bridging aluminum atoms or linked to extender moieties such as ethylene groups). The stepwise reaction can be conducted with from one, preferably at least two cycles (where each cycle comprises reaction with TMA followed by reaction with water), and typically from 2 to 1000 cycles, preferably 2 to 200 cycles, in some embodiments at least 10 cycles or from 10 to 100 cycles. The aluminum-oxo layer can be made from cycles of TMA and water but more preferably cycles with extender molecules such as ethylene glycol that form bridging moieties that may subsequently be removed in an annealing step. Ethylene glycol, propylene glycol, glycerol, and butanediol (iso- or n-butanediol or triol) are especially preferred, but other compounds suitable for MLD (for example erythritol, hydroquinone, sugars, etc.) can be employed prior to a subsequent processing step.

The resulting aluminum-oxide-hydroxide can be reacted with Reactant A as discussed below. Alternatively, coatings with superior stability and superior water resistance may be formed by annealing the metal-oxide-hydroxide layer formed by ALD. The annealing step may be accomplished by utilizing heating at a temperature in excess of 100° C., or contact with water (liquid or gaseous) at approximately a temperature of 1-200° C. For annealing without liquid water, the annealing step is preferably carried out in the presence of an oxygen containing gas, which could be air or other mixture such as dry air, nitrogen/oxygen mixtures, etc. and could be ambient or in a flowing gas. As an alternative or addition to thermal oxidation, the anneal could be conducted via ozonolysis or plasma oxidation. In another embodiment, the annealing step may be carried out in an inert environment such as Argon or Nitrogen gas, or a waterless and oxygen-less gas providing a conducting film. In some preferred embodiments, the annealing step is carried out for at least 30 mins or at least 1 hour or at least 2 hours, and in some embodiments in the range of 0.5 to 30 hours or 1 hour to 10 hours, at a temperature above 100° C., preferably at least 140° C., or at least 200° C., or at least 400° C., and preferably less than 1000° C., in some embodiments in the range of 140 to 800° C., or 200 to 700° C., or 400 to 600° C. Methods of making the porous aluminum oxide layer include those described in U.S. patent application Ser. No. 14/809,906, US Published Patent Application No. 20150329963 which is incorporated herein by reference.

The resulting aluminum oxide is not a dense, highly crystalline alumina but rather a porous aluminum oxide layer that forms a superior base for subsequent reaction with molecules to create the hydrophobic coating. This porous aluminum oxide base can be surface treated to generate surface hydroxyls for subsequent reaction with an initiator or electrophile. The optional aluminum oxide layer preferably has a thickness in the range of 1 to 1000 nm or to 500 or to 300 or to 100 nm, more preferably 2 nm to 500 nm or 4 to 20 nm. The invention includes the intermediate structure comprising this laminate including the porous aluminum oxide layer. The invention may also include this intermediate structure directly reacted with a terminating group; however, superior coatings are obtainable by alternating (Reactant A/Reactant B) MLD layers intervening the optional aluminum oxide layer and the terminating moiety.

The optional porous alumina layer may be applied directly onto the substrate or, more typically, pretreated substrate surface. The optional initiator, if present, can be applied before and/or after the porous alumina layer. The optional initiator followed by Reactant A/Reactant B ALD/MLD is preferably applied onto the (optional) porous layer comprising aluminum oxide. The porous alumina layer can be replaced by another metal such as porous titania, porous vanadia, porous hafnia, porous zirconia, porous silica, porous zinc oxide, or combinations thereof by substitution of TMA in whole or in part with precursors of the desired metal.

Description of Reactants

In preferred embodiments, the reactive moieties on one reactant, for example, in some preferred embodiments, Reactant A comprises: isocyanates (R—NCO), acrylates, carboxylic acids, esters, epoxides, amides and amines, and combinations thereof. In some preferred embodiments, Reactant A comprises a diisocyanate, a diacrylate, a dicarboxylic acid, a diester, diamide or a diamine. In some preferred embodiments, the reactive moieties on Reactant B comprise alcohols or amines, and combinations thereof. In some preferred embodiments, Reactant B comprises a diol, an amine alcohol, or a diamine.

As is known for MLD processes, the reaction order can be AB, ABC, ABCD, ABCDABABCD, or any desired order provided that the chemical entities react with each other in the desired order. Each of the reactants has at least two reactive moieties (this includes the possibility that the reactant is modifiable to have two reactive moieties such as having a first reactive moiety and a second reactive moiety that is temporarily blocked by a protecting group or requires activation for subsequent reaction such as UV activation). In some preferred embodiments, the reactants have exactly two reactive moieties since higher numbers of reactive groups may lead to lower packing density. In some preferred embodiments, the films have at least three repeating units (e.g., ABABAB), or at least 5, or at least 10, or at least 50, and sometimes in the range of 2 to 1000, or 5 to 100. By "reactive" it is meant under normal MLD conditions and commercially relevant timescales (for example, at least 50% reacted within 10 hours under appropriate reaction conditions). For control of film quality, the reactants may be singly reactive during each step of the MLD process to avoid reacting twice to the surface, and the reactants should not self-react and condense onto the surface.

In some preferred embodiments at least one or all of the reactants in the repeating units have chain lengths between reactive moieties of from 2 to 40 atoms (typically carbon atoms although heterogroups such as oxygen may be present), or from 2 to 10 atoms, or from 2 to 5 atoms. In some preferred embodiments, the reactants have straight chains (i.e., no branching) between reactive moieties to enhance packing density. In some preferred embodiments, the chains between reactive moieties are non-reactive; however, in some embodiments, there may be moieties within the chains that are capable of cross-linking to adjacent chains. In some preferred embodiments, the capping layer and/or the MLD layers very near the surface (e.g., within 5 cycles or within 2 cycles of the capping layer or surface) are branched for enhanced hydrophobicity and/or enhanced oleophobicity.

Reactive compounds and moieties for MLD may comprise, but are not limited to: isocyanate, alkylsilane, silacyclopentane and other cyclic silanes, anhydride, carboxylic acid, amine, acyl chloride, alcohol (including, for example, diols and triols), epoxides (which could be produced in-situ such as by reaction of alkenes with ozone), acrylates, thiols, alkenes, lactones, aldehyde, hydrazide, and cyanocarbons. Metal-containing compounds for ALD/MLD may include metal chlorides, dialkylzinc, metal alkoxides, metal alkyls (including straight or branched alkyls and complexes (e.g., cyclopentadienyl compounds), metal acetates, metal carboxylates, and metal carbonyls.

Coupled reactions may include, but are not limited to: isocyanate with alcohol, isocyanate with amine, amine-acrylate-ester with epoxy, metal chloride with alcohol, metal alkyl with isocyanate, anhydride with amine, amine with acyl chloride, alcohol with acyl chloride, alkene with thiol, TMA with alcohol, titanium compounds with alcohols, and metal acetate with carboxylic acid.

In one embodiment of the invention, a polyurea coating onto the object or powder is employed. This polyurea coating may or may not be fluorinated. An example of a polyurea coating could include reaction of a diisocyanate, for example, 1,4-diisocyanatobutane, with a diamine, for example 1,4 diamino butane. In this example, each chemical is heated to a point at which enough vapor pressure enables enough vapor (gas) delivery of the chemical to the object/substrate being coated. For example, 5 g of 1,4 diamino butane is attached to an ALD system and heated to 100° C. 5 g of 1,4-diisocyanatobutane is also attached to the same ALD system and heated to 80° C. 1 g of N-(2-aminoethyl)-3-aminopropyltrimethoxysilane is attached to the ALD system and heated to 40° C. Additionally, 1 g of 2,2,3,3,4,4,4-heptafluorobutylamine is attached to the same ALD system and heated to 40° C. A substrate, such as a 5-inch by 3-inch aluminum object is placed into the ALD system and heated to 120° C. The aluminum object is exposed first to N-(2-aminoethyl)-3-aminopropyltrimethoxysilane then to 100 sequential exposures of 1,4-diisocyanatobutane and 1,4 diamino butane. Finally, the coated object is exposed to the 1,4-diisocyanatobutane and then 2,2,3,3,4,4,4-heptafluorobutylamine. The resulting fluorinated polyurea coating on the surface has a thickness of 40 nm and a contact angle of >100°.

In another embodiment, 1,4-diisocyanatobutane is reacted with a diol, for example 1H,1H,4H,4H-perfluoro-1,4-butanediol. In this example, each chemical is heated to a point at which enough vapor pressure enables enough vapor (gas) delivery of the chemical to the object/substrate being coated. Sequential exposures of the two molecules result in a coating. For example, 5 g of 1H,1H,4H,4H-perfluoro-1,4-butanediol is attached to an ALD system and heated to 90° C. 5 g of 1,4-diisocyanatobutane is also attached to the same ALD system and heated to 80° C. 1 g of N-(2-aminoethyl)-3-aminopropyltrimethoxysilane is attached to the ALD system and heated to 40° C. Additionally, 1 g of 1H,1H-perfluoro-1-hexanol is attached to the same ALD system and heated to 100° C. A substrate, such as a 5-inch by 3-inch aluminum object is placed into the ALD system and heated to 120° C. The aluminum object is exposed first to N-(2- aminoethyl)-3-aminopropyltrimethoxysilane then to 100 sequential exposures of 1,4-diisocyanatobutane and 1H,1H,4H,4H-perfluoro-1,4-butanediol. Finally, the coated object is exposed to the 1,4-diisocyanatobutane and then 1H,1H-perfluoro-1-hexanol. The resulting fluorinated polyurethane coating on the surface has a thickness of 50 nm and a contact angle of >105°.

Further examples of reactants for MLD include; hexamethylene diisocyanate (or similar molecule where number of Cs=2-20; note that "Cs" means carbons), phenylene diisocyanate, isocyanates in either ortho (1,2), meta (1,3), or para (1,4) configurations, triisocyanate versions of this or similar molecules with three or more isocyanate groups, 1,8-diisocyanato-4-isocyanatomethyloctane or any other branched molecule with either 2 or 3 isocyanate functional groups, perfluoro diacrylates (where number of Cs=2-20), di-acids (perfluoro or not) (number of Cs=2-20), perfluoro-3,6-dioxaoctane-1,8-dioic acid, where number of "$OC_2F_4$" (repeating groups have n=1-15), perfluoro di esters (number of Cs=2-20), trimethylaluminum, ethylene oxide and derivatives, perfluoro triols (number Cs=2-20) for each branch, perfluoro diols (number of Cs=2-20), perfluoro ether diols (number of "$OC_2F_4$" repeating groups have n=1-15), primary, secondary and tertiary di amines where R=$(CF_2)_x$ $NH_2$, aminoalcohols where all these could be fluorinated, partially fluorinated or non-fluorinated).

The MLD layer is reacted with a terminating reactant that caps the layer with a hydrophobic (and preferably oleophobic) moiety, especially a highly fluorinated moiety. Branched terminating moieties may be preferred for enhanced hydrophobicity and oleophobicity.

Terminating Groups

The following materials could be used as terminating groups for the films; perfluoro cyanates (n=2-30) fluorinated, partially fluorinated or non-fluorinated, perfluoro ether esters, branched perfluoro acids e.g., perfluoro-3,5,5-trimethylhexanoic acid, branched perfluoro alcohols, one alcohol group with branched fluorinated carbons, perfluoro alcohols, perfluoro ether alcohols (where number of "$OC_2F_4$" repeating groups have n=1-15), perfluoro acids where $CF_2$ units n=2-20, perfluoro amines.

The terminating groups described above have monofunctional linkages that are preferred in some embodiments especially where the terminating groups cap carbon chains. Alternatively, the terminating agents may comprise multiple functional linkages (e.g., bifunctional or trifunctional, where the function refers reaction to reaction with the underlying layer) such as trimethoxysilanes, trichlorosilanes, bi- and tri-epoxides, and aminosilanes (and specifically methylbis(dimethylamino)silanes) with carbon chain lengths between 2 and 30, or between 2 and 20, or between 2 and 10, and fluorine content ranging from 1 fluorine to all fluorines in place of hydrogens. Heteroatoms, such as oxygen in ether groups, may be present where the groups do not decrease stability to humidity. Some additional examples of terminating agents include: heptadecafluorodecyltrimethoxysilane, (heptafluoroisopropoxy)propyltrichlorosilane, octadecyldimethylchlorosilane, octadecyltrichlorosilane, tris(trimethylsiloxy)-silylethyldimethylchlorosilane, octyldimethylchlorosilane, dimethyldichlorosilane, butyldimethylchlorosilane, and trimethylchlorosilane. Phosphonic acids and derivatives may also be used, for example, dodecylphosphonic acid, octadecylphosphonic acid, and octylphosphonic acid.

Reactants having more than two reactive moieties such as tri-functional, tetra-functional or higher functionality may increase bonding within the coating leading to enhanced toughness. This enhanced toughness may be beneficial to performance for example on a device that is exposed to abrasive environments.

Terminating agents may also comprise terminating agents at opposite ends of a flexible chain (e.g., a hydrocarbon or fluorocarbon chain having the lengths and compositions described above) that can bond at two ends of the terminating agent—this configuration can improve durability; examples include $(RO)_3Si(CH_2)_xSi(OR)_3$ where x is between 2 and 30, or between 2 and 20, or between 2 and 10, and fluorine content ranging from 1 fluorine to all fluorines in place of hydrogens. Terminating agents having multiple functional groups along the length of a carbon chain may also be used to bond in multiple locations to the underlying surface. Terminating agents may also have cross-linking moieties (such as alkenes) within the chains; the cross-linking groups can be reacted subsequent to application of the terminating layer.

Typically, the underlying layer has surface-exposed hydroxyl or alkoxy groups that react with the halo-, alkoxy-, or amino-functional group to form a covalent bond between the terminating agent and underlying layer. The underlying layer may be made by the MLD or ALD techniques described herein.

The reactants described above and in the Table below include reactants or reactive moieties that may be used in the present invention, either as shown, or in some preferred embodiments where some, at least half, or all of the $CH_x$ groups are replaced by $CF_x$ groups. The invention may be characterized as including any of these reactions or combinations of these reactions. The inventive reactions may use a catalyst to facilitate the reaction(s). Gaseous catalysts are preferred and/or may include UV light, IR to increase energy, or magnetic fields to facilitate reactions and/or increase packing density. The coupling reactions of the type AB, etc. are a known type of coupling reaction (although some are not yet known for ALD/MLD surface chemistry); so, selection of reactants that will couple to each other can be selected based on general chemical knowledge.

Table of Reactants for MLD Coatings

| PRECURSOR A | PRECURSOR B | PRECURSOR C | PRECURSOR D |
| --- | --- | --- | --- |
| 7-octenyltrichlorosilane (7-OTS) | Ozone | Titanium isopropoxide (TTIP) | Water |
| 7-octenyltrichlorosilane (7-OTS) | Ozone | Zirconium tetat-tert-butoxide (ZTB) | Water |
| 7-octenyltrichlorosilane (7-OTS) | Ozone | Aluminum isopropoxide (ATIP) | Water |
| 7-octenyltrichlorosilane (7-OTS) | Ozone | Trimethylaluminum (TMA) | Water |
| Titanium Chloride | Ethanolamine (EA) | Malonyl chloride (MC) | Ethanolamine (EA) |
| Diethylzinc (DEZ) | 1,4-phenylene diisocyanate (PD) | Ethylene diamine (EDA) | 1,4-phenylene diisocyanate (PD) |

-continued

Table of Reactants for MLD Coatings

| PRECURSOR A | PRECURSOR B | PRECURSOR C | PRECURSOR D |
|---|---|---|---|
| alkoxysilane (N-(2-AMINOETHYL)-2,2,4-TRIMETHYL-1-AZA-2-SILACYCLOPENTANE [CAS 18246-33-8]) | 1,4 diisocyanobutane [CAS 929-25-9] | 1H,1H,8H,8H-Dodecafluorooctane-1,8-diol [CAS 90177-96-1]. | 2,2,3,3,4,4,5,5,6,6,7,7,8,8,8-pentadecafluoro-1-octanol |
| (N-(2-AMINOETHYL)-2,2,4-TRIMETHYL-1-AZA-2-SILACYCLOPENTANE) | 1,4-diisocyanate | $CF_3(CF_2)_xCH_2OH$ | |
| (N-(2-AMINOETHYL)-2,2,4-TRIMETHYL-1-AZA-2-SILACYCLOPENTANE) | 1,4-diisocyanate | $HOCH_2(CF_2)_8CH_2OH$ | |
| 7-OTS | H2O | O3 | |
| Pyromellitic Anhydride (PMDA) | 4,4'-diaminodiphenyl ether (DDE) | Terephthaloyl chloride (TPC) | |
| Pyromellitic Anhydride (PMDA) | 4,4'-Oxydianiline (ODA) | Terephthaloyl chloride (TPC) | |
| Trimethylaluminum (TMA) | Ethanolamine (EA) | Maleic anhydride (MA) | |
| fluorinated alucone polymer | trimethyl aluminum | 2,2,3,3,4,4,5,5,6,6,7,7,8,8,-pentadecafluoro-1-octanol [CAS number 307-30-2] | |
| trimethyl aluminum | 1H,1H,6H,6H-Perfluoro-1,6-hexanediol | | |
| Amines | isocyanates | | |
| isocyanates | diols | | |
| PD | EDA 67 | | |
| Amine-acrylate esters | epoxies | | |
| diamines | reactive chlorides | | |
| Dienes | thiols | | |
| aluminum-containing molecules or moieties | diols | | |
| Pyromellitic dianhydride (PMDA) | 4,4'-diaminodiphenyl ether (DDE) | | |
| Pyromellitic dianhydride (PMDA) | 4,4'-oxydianiline (ODA) | | |
| Pyromellitic dianhydride (PMDA) | 2,4-diaminonotrobenzene (DNB) | | |
| Pyromellitic dianhydride (PMDA) | p-phenylenediamine (PPDA) | | |
| Pyromellitic dianhydride (PMDA) | Ethylene diamine (EDA) | | |
| Pyromellitic dianhydride (PMDA) | 1,6-hexanediamine (HD) | | |
| Terephthalaldehyde(TPA) | p-phenylenediamine (PPDA) | | |
| Terephthalaldehyde (TPA) | Oxalic dihydrazide (ODH) | | |
| 1,6-hexanediamine (HD) | Adipoyl chloride (AC) | | |
| p-phenylenediamine (PPDA) | Terephthaloyl chloride (TPC) | | |
| 1,4-butane diamine (BDA) | Terephthaloyl chloride (TPC) | | |
| Ethylene diamine (EDA) | 1,4-phenylene diisothiocyanate (DITC) | | |
| Ethylene glycol (EG) | Terephthaloyl chloride (TPC) | | |
| 1,2-butanediol (BD) | Malonyl chloride (MC) | | |
| MoCl5 | 3,4-Ethylenedioxythiophene | | |
| 1,7-octadiene (OcDE) | 1,2-ethanedithiol (EDT) | | |
| 1,7-octadiene (OcDE) | 1,4-butanedithiol (BuDT) | | |
| 1,7-octadiene (OcDE) | 1,10-decanedithiol (DDT) | | |
| 1,7-octadiene (OcDE) | 1,4-benzenedimethanethiol (BDMT) | | |
| 1,7-octadiene (OcDE) | 1,4-benzenedithiol (BeDT) | | |
| 1,11-dodecadiene (DoDE) | 1,10-decanedithiol (DDT) | | |
| Trimethylaluminum (TMA) | Ethylene glycol (EG) | | |
| Trimethylaluminum (TMA) | 1,2-ethanediol (EDO) | | |

-continued

Table of Reactants for MLD Coatings

| PRECURSOR A | PRECURSOR B | PRECURSOR C | PRECURSOR D |
|---|---|---|---|
| Trimethylaluminum (TMA) | 1,4-butanediol (BDO) | | |
| Trimethylaluminum (TMA) | 1,6-hexanediol (HDO) | | |
| Trimethylaluminum (TMA) | Hydroquinone (HQ) | | |
| Trimethylaluminum (TMA) | Tetrafluorhydroquinone (FHQ) | | |
| Trimethylaluminum (TMA) | Lactic Acid (LC) | | |
| Trimethylaluminum (TMA) | Glycerol (GL) | | |
| Trimethylaluminum (TMA) | Triethanolamine (TEA) | | |
| Trimethylaluminum (TMA) | p-phenylenediamine (PPDA) | | |
| Trimethylaluminum (TMA) | Glycidol (GLY) | | |
| Trimethylaluminum (TMA) | Caprolactone (LAC) | | |
| Titanium chloride | Ethylene glycol (EG) | | |
| Titanium chloride | 1,2-ethanediol (EDO) | | |
| Titanium chloride | Glycerol (GL) | | |
| Titanium chloride | Triethanolamine (TEA) | | |
| Titanium chloride | Fumaric acid (FC) | | |
| Tetrakis(dimethylamido)titanium (TDMATi) | Ethylene glycol (EG) | | |
| Tetrakis(dimethylamido)titanium (TDMATi) | 1,2-ethanediol (EDO) | | |
| Tetrakis(dimethylamido)titanium (TDMATi) | Glycerol (GL) | | |
| Diethylzinc (DEZ) | Ethylene glycol (EG) | | |
| Diethylzinc (DEZ) | 1,2-ethanediol (EDO) | | |
| Diethylzinc (DEZ) | Hydroquinone (HQ) | | |
| Diethylzinc (DEZ) | 1,2,4-trihydroxybenzene (THB) | | |
| Diethylzinc (DEZ) | 2,4-hexadiyne-1,6-diol (HDD) | | |
| Diethylzinc (DEZ) | Glycerol (GL) | | |
| Diethylzinc (DEZ) | 4-aminophenol (AP) | | |
| Diethylzinc (DEZ) | 4,4'-diaminodiphenyl ether (DDE) | | |
| Diethylzinc (DEZ) | 4,4'-oxydianiline (ODA) | | |
| zirconium tetra-tert-butoxide (ZTB) | Ethylene glycol (EG) | | |
| zirconium tetra-tert-butoxide (ZTB) | 1,2-ethanediol (EDO) | | |
| Tetrakis(dimethylamido)hafnium (TDMAHf) | Ethylene glycol (EG) | | |
| Tetrakis(dimethylamido)hafnium (TDMAHf) | 1,2-ethanediol (EDO) | | |
| Bis(ethylcyclopentadienyl)manganese (Mn(CpEt)2) | Ethylene glycol (EG) | | |
| Bis(ethylcyclopentadienyl)manganese (Mn(CpEt)2) | 1,2-ethanediol (EDO) | | |
| Tetrakis(ethylmethylamido)vanadium (TEMAV) | Ethylene glycol (EG) | | |
| Tetrakis(ethylmethylamido)vanadium (TEMAV) | 1,2-ethanediol (EDO) | | |
| Tetrakis(ethylmethylamido)vanadium (TEMAV) | Glycerol (GL) | | |
| Trimethyl aluminum (TMA) | 8-hydroxyquinoline | | |
| Diethylzinc (DEZ) | 8-hydroxyquinoline | | |
| Titanium Chloride | 8-hydroxyquinoline | | |
| Zinc acetate | 1,4-benzenedicarboxylic (BDC) | | |
| Zinc acetate | 2,6-napthalenedicarboxylic (NDC) | | |
| Copper 2,2,6,6-tetramethyl-3,5,-heptadionate (Cu(thd)2) | 1,4-benzenedicarboxylic (BDC) | | |
| Lithium 2,2,6,6-tetramethyl-3,5,-heptanedionate (Li(thd)) | 1,4-benzenedicarboxylic (BDC) | | |
| Vanadium hexacarbonyl | Tetracyanoethylene (TCNE) | | |
| Dicobalt octacarbonyl | Tetracyanoethylene (TCNE) | | |
| (1 E)-prop-1-ene-1,2,3-tricarboxylic acid | | | |
| (2 E, 4 E)-hexa-2,4-dienedioic acid | | | |
| (2S)-2-aminopentanedioic acid | | | |
| (Z)-butenedioic acid (maleic acid) | | | |
| 1,2-bis[(diamethylamino)dimethylsilyl]ethane | | | |
| 1,4-diaminobenzene | | | |
| 1,4-diisocyanatobenzene | | | |
| 1,4-diisothiocyanatobenzene | | | |
| 2-aminoethanol | | | |

-continued

Table of Reactants for MLD Coatings

| PRECURSOR A | PRECURSOR B | PRECURSOR C | PRECURSOR D |
|---|---|---|---|
| 2-oxepanone (caprolactone) | | | |
| 4,4'-oxydianiline | | | |
| 4-aminophenol | | | |
| 4-nitrobenzene-1,3-diamine | | | |
| 8-quinolinol | | | |
| benzene-1,2,4,5-tetracarboxylic acid | | | |
| benzene-1,3,5-tricarboxylic acid | | | |
| benzene-1,3,5-triol | | | |
| benzene-1,3-dicarboxylic acid | | | |
| benzene-1,4-dicarboxylic acid | | | |
| benzene-1,4-diol | | | |
| benzoic acid | | | |
| but-2-yne-1,4-diol | | | |
| butane-1,4-diamine | | | |
| butanedioic acid | | | |
| decane-1,10-diamine | | | |
| decanedioic acid | | | |
| decanedioyl dichloride | | | |
| ethane-1,2-diamine | | | |
| ethane-1,2-diol | | | |
| ethanedihydrazide | | | |
| ethanedioic acid | | | |
| ethanetetracarbonitrile | | | |
| furan-2,5-dione | | | |
| furo[3,4-f][2]benzofuran-1,3,5,7-tetrone | | | |
| heptane-1,7-diamine | | | |
| heptanedioic acid | | | |
| hexa-2,4-diyne-1,6-diamine | | | |
| hexanedioyl dichloride | | | |
| N-(2-aminoethyl)ethane-1,2-diamine | | | |
| N,N-bis(2-aminoethyl)ethane-1,2-diamine | | | |
| nonanedioly dichloride | | | |
| octane-1,8-diamine | | | |
| octanedioic acid | | | |
| octanedioyl dichloride | | | |
| oxiran-2-ylmethanol | | | |
| pentanedioic acid | | | |
| propane-1,2,3-tricarboxylic acid | | | |
| propane-1,2,3-triol | | | |
| propanedioic acid | | | |
| propanedioyl dichloride | | | |
| terephthalaldehyde | | | |
| terephthalic acid bis(2-hydroxyethyl) ester | | | |
| terephthaloyl dichloride | | | |
| tris(2-aminoethyl)amine | | | |
| tris(2-hydroxyethyl)amine | | | |
| FOMB(DMA)S | | | |
| 1H,1H,6H,6H-Perfluoro-1,6-hexanediol | | | |
| 2,2,3,3,4,4,5,5,6,6,7,7,8,8,-pentadecafluoro-1-octanol | | | |
| Fluroinated diols | | | |
| 1H,1H,6H,6H-Perfluoro-1,6-hexanediol | | | |
| 2,2-Dimethoxy-l,6-diaza-2-silacyclooctane | | | |
| (N,N-Dimethyaminopropyl)-AZA-2-Methyl-2-methoxysilacyclopentane | | | |
| N-methyl-aza-2,2,4-trimethylsilacyclopentane | | | |
| N-ethyl-2,2-dimethyl-1-aza-2-silacyclopentane | | | |
| N-(2-aminoethyl)-2,2,4-trimethyl-1-aza-2-silacyclopentane | | | |
| perfluoro ether esters | | | |
| Perfluoro alcohols | | | |
| Hexamethylene diisocyanate | | | |
| Phenylene diisocyanate | | | |
| 1,8-Diisocyanato-4-isocyanatomethyloctane | | | |
| Perfluoro diacrylates | | | |
| Di-acids | | | |
| Perfluoro-3,6-dioxaoctane-1,8-dioic acid | | | |
| Perfluoro di esters | | | |
| Ethylene Oxide | | | |
| Perfluoro triols | | | |
| Perfluoro diols | | | |
| Perfluoro ether diols | | | |

Table of Reactants for MLD Coatings

| PRECURSOR A | PRECURSOR B | PRECURSOR C | PRECURSOR D |
| --- | --- | --- | --- |
| primary di amines ($RNH_3$) | | | |
| secondary di amines ($R_2NH$) | | | |
| tertiary di amines ($R_3N$) | | | |
| Aminoalcohols | | | |
| Perfluoro cyanates | | | |
| Branched perfluoro acids | | | |
| Branched perfluoro alcohols | | | |
| Perfluoro ether alcohols | | | |
| Perfluoro acid | | | |

In preferred embodiments, the film formed by the MLD process comprises carbon chains arranged in films somewhat like lipid layers with the chain lengths substantially perpendicular to the substrate surface. In some embodiments, the film formed by the MLD process comprises unsaturated bonds or potentially reactive side groups; these unsaturated bonds and/or reactive side groups are reacted with each other forming cross-links that strengthen and add stiffness to the film; various cross-linking chemistries are known in the field of polymer chemistry.

Coated Articles

In some preferred embodiments, the MLD process results in films comprising polyurethanes, polyacrylates, polysiloxanes, polyesters, polyamides, polythioureas, polyimides, polyamide-polyamides, alucones or other metal cones. While these compounds are identified as polymers, they might be more accurately described as oligomers since they typically contain less than 200 repeating groups, in some embodiments 2 to 100 or 2 to 50 repeating groups, in some embodiments, 3 to 40 repeating groups.

In any of the processes for making films (and the resulting films), it may be desirable for the reactants to be partly or completely fluorinated in which fluorine replaces hydrogen in the hydrocarbon chain connecting reactive moieties; for example, the reactants (or films) may comprise a F/H atomic ratio of at least 0.1 or at least 0.5, or at least 1; or at least 5, or at least 10. In many preferred embodiments, the hydrophobic films should not be readily hydrolyzable, so, in some embodiments, the films do not contain anhydride linkages; similarly, metal atoms may not be desirable, and, in some embodiments, the films comprise less than 10 mass % or less than 5 mass %, or less than 1 mass % transition metals in the outer (surface) 2 nm or 5 nm or 10 nm of film thickness; and, in some embodiments, the same limitations apply to semimetals.

The coated structure may be described by various chemical structures as determined from knowledge of starting materials or inference from chemical and structural analyses. Alternatively, or in addition, the coated structure can be directly characterized by measurable properties such as: visible transmittance of at least 90% at all points in the visible spectrum; or water contact angles of at least 100°, or at least 105°, or at least 110°, a haze of 0.5% or 0.3, or 0.2% or less; a water sliding angle of 15° or less, or 10° or less; a high packing density such as determined by mass per thickness; ellipsometry measurements; abrasion resistance; chemical durability; UV durability; the entire coating having thickness of 100 nm or less from the substrate surface to the exterior of the terminating layer; with each sublayer having a thickness of at least 0.2 or at least 0.5 nm and up to about 20 nm; TEM and SEM; chemical analysis such as surface methods for measuring chemical composition and/or distribution.

The hydrophobic coated surface may further, or alternatively, be characterized by one or any combination of: a specified visible transmittance or other physical measured property; an optical clarity of at least 80% or at least 90% over the visible spectrum from 400 to 700 nm; specified layer thicknesses for example a coating thickness in the range of 0.5 nm to 200 nm, or 1 nm to 100 nm, or 1 nm to 50 nm, or 0.5 nm to 20 nm; a porous layer comprising aluminum oxide disposed between the glass substrate and the hydrophobic layer; and having specified layer spectrometric characteristics. The invention includes a substrate comprising a hydrophobic surface film wherein the film on the top surface is characterizable by a high shear strength having the best score on a 0 to 5 scale as measured according to ASTM D3359; a water contact angle of at least 100° more preferably at least 110° on the surface; and further characterizable by birefringence or other anisotropic interaction with polarizable light (for example, polarized soft x-rays; or x-ray diffraction (XRD) that shows higher order structure or x-ray reflectivity (XRR) that shows higher order structure, or a combination of these spectroscopic properties. Optionally, the film comprises at least 5 or at least 10 or at least 20 mass % F in the top (surface) 1 nm or top 5 nm or top 10 nm of film, and/or having a F/O atomic ratio of at least 2 or at least 5 or at least 10 or at least 20 in the top (surface) 1 nm or top 5 nm or top 10 nm of film. Optionally, the film comprises at least 5 or at least 10 or at least 20 mass % C in the top (surface) 1 nm or top 5 nm or top 10 nm of film, and/or having a C/O atomic ratio of at least 2 or at least 5 or at least 10 or at least 20 in the top (surface) 1 nm or top 5 nm or top 10 nm of film. Preferably, the film exhibits a haze of 5% or less, preferably 2%, 1%, or 0.5% or less after exposure to 100% humidity in air at standard temperature and pressure. Preferably, the films have an olephobicity contact angle (analogous to water contact angle but measured with ethylene glycol) of at least 100°, more preferably at least 120°, and still more preferably at least 160°.

The following standard test protocols may be used to evaluate the films produced in this innovation.

ASTM F21-14 Standard Test Method for Hydrophobic Surface Films by the Atomizer Test https://www.astm.org/Standards/F21.htm ASTM C813-90(2014) Standard Test Method for Hydrophobic Contamination on Glass by Contact Angle Measurement https://www.astm.org/Standards/C813.htm ASTM D7334-08(2013) Standard Practice for Surface Wettability of Coatings, Substrates and Pigments by Advancing Contact Angle Measurement https://www.astm.org/Standards/D7334.htm ASTM C1649-14 Standard Practice for Instrumental Transmittance Measurement of Color for Flat Glass, Coated and Uncoated https://www.astm.org/Standards/C1649.htm ASTM D7334-08(2013) describes testing conditions for measuring contact angle of the films according to the present invention. ASTM D1003-13 describes testing conditions for measuring haze. Haze for the inventive films is preferably less than 5%, more preferably less than 2%, and still more preferably 0.5% or less.

Water contact angle of the films is measured using standard techniques to evaluate the hydrophobic or hydrophilic nature of the films. Optical clarity is measured using standard UV-Vis techniques. The films will demonstrate uniformity and adhesion to the underlying support such as glass. This will be evaluated through cross-sectioning the film (and the support) and using optical microscopy such as SEM or TEM to measure the film thickness at several points (in some preferred embodiments, the film coating thickness varies by 10% or less over at least 50% of a continuous length of the coated substrate). The materials produced by our innovation will provide films with thicknesses with little deviation at various locations. In addition, these analyses will demonstrate few areas of delamination between the film and the substrate. We will be able to use solid-state $^{19}$F MAS NMR to obtain qualitative and quantitative analysis of the type and quantity of the monomers in our thin films. The $^{19}$F nucleus has a natural abundance of 100 percent and a high gyromagnetic ratio which provides which allows us to readily determine the number, type, and bonding of the monomer sequences present in our thin film.

X-ray photoelectron spectroscopy (XPS) in combination with time-of-flight secondary ion mass spectrometry (TOF-SIMS) will provide us with information about our thin film's structure and surface composition. TOF-SIMS and XPS analyses will allow us to compare amounts of fluorine-containing functional groups (including $CF_2$ and $CF_3$) in different fluorocarbon films. In addition, curve-fitted XPS results will allow us to examine the degree of cross-linking and $CF_2$ concentrations.

Any of the inventive articles or methods can be characterized by one or any combination of the following characteristics:

In-situ Quartz Crystal Microbalance (QCM)—A QCM converts a change in the frequency of an oscillating quartz crystal to a mass change, with nanogram sensitivity. In this manner, it is possible to quantify the mass added during each reaction in the ALD/MLD process and thereby monitor the film growth in-situ. The QCM is used as a process control metric to ensure that ALD or MLD precursors doses and purge times are sufficient in the reactor.

Observed results for QCM during deposition of MLD may include:

mass gain per MLD cycle of 2-500 ng/cm$^2$, more specifically 10-100 ng/cm$^2$, more specifically 40-70 ng/cm$^2$ (area here refers to geometric area that can be measured by eye; not surface area). Longer chain precursors will result in higher mass gains while shorter chain precursors will result in lower mass gains over time. The shape of the plot of mass gain/thickness (Y axis) vs time/number of cycles (X axis) will be a staircase shape when looking closely at the data and will be close to linear moving from the bottom left towards the top right of the graph. X-ray reflectivity (XRR) can be used for evaluating thickness, densities and roughness of the ALD/MLD thin films. X-ray reflected from different interfaces interfere constructively and destructively as a function of incoming angle, Kiessig fringes. This information can be used to calculate reflection and transmission coefficients for each layer in a multilayer system Expected observations may include: Kiessig fringes that indicate a homogeneous coating; Kiessig fringes that indicate a super lattice structure.

Densities on the order of 0.4-4 g/cm$^3$, in some embodiments 1.8-2.5 g/cm$^3$;

due to the highly uniform nature of the inventive methods, the resulting films have uniquely uniform density as a function of distance from the substrate; this uniformity can be observed by cross-sectional analysis such as by electron microscopy or by mass gain per MLD cycle showing a constant addition for each cycle (or within 80% or 90% per cycle comparing the final cycle with the median cycle).

Film thicknesses of 1-50 nm, more specifically 1-10 nm.

The crystallinity of the films is examined by X-ray diffraction (XRD). XRD involves the scattering of X-rays by regularly spaced atoms of a crystal, which is useful in obtaining information about the structure of the crystal.

Expected observations may include:

Evidence of crystalline grains due to regular orientation of the atoms in the MLD film.

Evidence of a fully amorphous coatings due to movement of atoms or irregular orientation of atoms in the MLD film.

The topography of the films can be investigated by using atomic force microscopy (AFM).

Expected observations may include:

Evidence that the MLD coating does not significantly increase the surface roughness of the substrates, such that added RMS roughness due to the MLD coating is of 0.1-5 nm, more specifically 0.1-0.5 nm.

Evidence that the MLD coating smooths the surface roughness such that after MLD coating, the surface roughness is decreased by 0.1-5 nm, more specifically 0.1-0.5 nm.

Fourier transform infrared (FTIR) spectroscopy is useful for analyzing the chemical state of the films.

Expected observations may include:

Signals corresponding to C—F, C—O, C=O, N—C, C—Cl and other functional organic and inorganic chemical functional groups (including, amides, imides, ureas, urethanes, alcoxides, chloroacids, carboxylic acids).

The composition of the films can be studied by X-ray photoelectron spectroscopy (XPS).

Expected observations may include:

Presence of specific elements expected to be in the film. Including but not limited to F, C, N, O, Cl, Si, Al, Zn, Ti.

Presence of a F:C ratio of between 3:1 and 0.1:1, more specifically between 1:1 and 2.5:1, or more specifically between 2:1 and 2.4:1

The presence of a metal can be verified by X-ray fluorescence (XRF) measurements.

Expected observations may include:

Presence of specific elements expected to be in the film. Including but not limited to Si, Al, Zn, Ti.

Nanoindentation gives insight on the mechanical properties of the films.

Expected observations may include:

A young's modulus of 1-4, more specifically 1.3-2.6, more specifically, 1.6-2.0. Vickers hardness of 5-220 MPa, more specifically 10-100 MPa, more specifically 20-40 MPa. Tensile yield stress of 10-100 MPa, more specifically 5-40 MPa, more specifically 10-18 MPa.

Other characteristics of the ALD/MLD films may include:
Specific gravity of 1.5-2.5, more specifically 1.7-2.2, more specifically 2-2.1 for the metal-containing portion of the film;
Yield strength of 5-80 MPa, more specifically 8-20 MPa, more specifically 9-13 MPa,
Elongation of 80-600%, more specifically 150-550%, more specifically 200-400%
Tensile modulus of 400-2600 MPa, more specifically 500-700 MPa, more specifically 550-650 MPa
Hardness of 50-100 Shore D, more specifically 50-80 Shore D, more specifically 55-65 Shore D The limiting oxygen index (LOI) is the minimum concentration of oxygen, expressed as a percentage, that will support combustion of a polymer. It is measured by passing a mixture of oxygen and nitrogen over a burning specimen and reducing the oxygen level until a critical level is reached. Limiting oxygen index of >30%, more specifically >95%.

The invention also includes particles that comprise the hydrophobic coating that is described herein. Methods of coating particles in fluidized bed reactors are known and need not be repeated here. The particles may be in the number average size range of 0.001 μm to 1 mm, or 0.01 to 500 μm. The particles can have a glass core or any core material that can have a surface with reactive groups for attaching the ALD or MLD coatings. In some aspects, the invention may include a mixture of the particles coated with the hydrophobic coating and particles coated with a hydrophilic coating; such a mixture can be separated by suspensions in aqueous and/or nonaqueous liquids and mixtures of an aqueous liquid with a nonmiscible liquid to make layered structures comprising a first layer comprising primarily particles with hydrophobic coatings and a second layer (typically adjacent the first layer) comprising primarily particles with hydrophilic coatings.

Conditions for ALD/MLD

Conditions for ALD are well known and will not be repeated here. ALD, if it is employed, can be conducted either with or without prior surface modifications. See, for example, George, "Atomic Layer Deposition: An Overview," Chem. Rev. 2010, 110, 111-131. A suitable and preferred method for depositing the films is through atomic layer deposition growth techniques. Atomic layer deposition permits the formation of deposits of up to about 0.3 nm in thickness per reaction cycle, and thus provide a means of extremely fine control over deposit thickness. In these techniques, the deposits are formed in a series of two or more self-limited reactions, which in most instances can be repeated to sequentially deposit additional layers of the deposited material until a desired thickness is achieved. In most instances, the first of these reactions will involve some functional group on the surface, such as an M-H, M-O—H or M-N—H group, where M represents an atom of a metal or semi-metal. The individual reactions are advantageously carried out separately and under conditions such that all excess reagents and reaction products are removed before conducting the succeeding reaction. It is preferred to treat the particles before initiating the reaction sequence to remove volatile materials that may be absorbed onto the surface. This is readily done by exposing the surfaces to elevated temperatures and/or vacuum. Also, in some instances a precursor reaction may be done to introduce desirable functional groups onto the surface to be coated.

Oxide deposits can be prepared on surfaces having hydroxyl or amine (MN—H) groups using a binary (AB) reaction sequence as follows. The asterisk (*) indicates the atom that resides at the surface and Z represents oxygen or nitrogen. $M^1$ is an atom of a metal (or semimetal such as silicon) and X is a displaceable nucleophilic group. The reactions shown below are not balanced and are only intended to show the reactions at the surface (i.e., not inter- or intralayer reactions).

(A1)

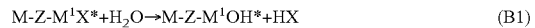

(B1)

In reaction A1, reagent $M^1X_n$ reacts with one or more M*—Z—H groups on the surface of the particle to create a new surface group having the form -$M^1$-X. $M^1$ is bonded to the surface through one or more Z atoms. The -$M^1$-X group represents a site that can react with water in reaction B1 to regenerate one or more hydroxyl groups. The hydroxyl groups formed in reaction B1 can serve as functional groups through which reactions A1 and B1 can be repeated, each time adding a new layer of $M^1$ atoms. Note that in some cases (such as, e.g., when $M^1$ is silicon, zirconium, titanium, boron, yttrium or aluminum) hydroxyl groups can be eliminated as water, forming $M^1$-O-$M^1$ bonds within or between layers. This condensation reaction can be promoted if desired by, for example, annealing at elevated temperatures and/or reduced pressures. Binary reactions of the general type described by equations A1 and B1, where $M^1$ is silicon, are described more fully in J. W. Klaus et al., "Atomic Layer Controlled Growth of $SiO_2$ Films Using Binary Reaction Sequence Chemistry", Appl. Phys. Lett. 70, 1092 (1997) and O. Sneh et al., "Atomic Layer Growth of $SiO_2$ on Si(100) and $H_2O$ using a Binary Reaction Sequence", Surface Science 334, 135 (1995), both incorporated herein by reference. Binary reactions of the general type described by equations A1 and B1, where $M^1$ is aluminum, are described in A C. Dillon et al.,"Surface Chemistry of $Al_2O_3$ Deposition using $Al(CH_3)_3$ and $H_2O$ in a Binary reaction Sequence", Surface Science 322, 230 (1995) and A W. Ott et al., "$Al_2O_3$ Thin Film Growth on Si(100) Using Binary Reaction Sequence Chemistry", Thin Solid Films 292, 135 (1997). Both references are incorporated herein by reference. General conditions for these reactions as described therein can be adapted to construct $SiO_2$ and $Al_2O_3$ coatings on surfaces. Analogous reactions for the deposition of other metal oxides such as $ZrO_2$, $TiO_2$ and $B_2O_3$ are described in Tsapatsis et al. (1991) Ind. Eng. Chem. Res. 30:2152-2159 and Lin et al., (1992), AIChE Journal 38:445-454, both incorporated herein by reference. A specific reaction sequence of the A1/B1 type that produces alumina is:

(A1)

(B1)

This particular sequence of reactions is particularly preferred to deposit alumina, as the reactions proceed well at temperature below 350 K. This particular reaction sequence tends to deposit $Al_2O_3$ ALD at a rate of ~0.12 nm per AB cycle. Triethyl aluminum (TEA) can be used in place of trimethyl aluminum.

In the foregoing reaction sequences, preferred metals $M^1$ include silicon, aluminum, yttrium, boron, titanium, zinc, magnesium and zirconium. Suitable replaceable nucleophilic groups will vary somewhat with $M^1$, but include, for example, fluoride, chloride, bromide, alkoxy, alkyl, acetylacetonate, and the like. Specific compounds having the structure $M^1X_n$ that are of particular interest are silicon tetrachloride, tungsten hexafluoride, tetramethylorthosilicate ($Si(OCH_3)_4$), tetraethylorthosilicate ($Si(OC_2H_5)_4$), trimethyl aluminum (Al(CH$_3$)$_3$), triethyl aluminum (Al(C$_2$H$_5$)$_3$), other trialkyl aluminum compounds, yttrium acetylacetonate, cobalt acetylacetonate, and the like.

Preferably, the films are made by adding reactants in the vapor phase or added to the system as solid that vaporizes; however, in some embodiments, this process is done in a liquid or supercritical phase, where each separate moiety is a pure substance or dissolved in a solvent and the substrate is contacted with the solution (e.g., dipped into the solution), rinsed, and, optionally, dried.

Either the substrate surface, or the modified substrate surface, or the substrate surface with porous aluminum oxide coating is then made hydrophobic, preferably by reacting with at least one preferably at least two cycles of Reactant A/Reactant B MLD. The number of cycles can be, for example, 1 to 1000, preferably 2 to 500, in some embodiments 2 to 100 or at least 3 or at least 5 and up to 500 or up to 200, or up to 50, or up to 10 AB cycles. Examples of suitable Reactant A and Reactant B are provided above and shown in the Examples.

The temperature at which the ALD or MLD process is conducted depends on the particular reactants and the substrate. The temperature is high enough that the reagents exhibit a vapor pressure of at least 1 milliTorr, more preferably at least 100 milliTorr and even more preferably at least 1 Torr. The temperature is also high enough that the reactants will react with surface species on the substrate. The temperature must not be so high that the coating or substrate thermally degrades. The temperature must be low enough that the substrate does not become distorted in the process. A suitable temperature range can be from 273 K to 1000 K, depending on the particular coating and the particular substrate. A preferred temperature range is from 273 K to 500 K and an even more preferred temperature range is from 300 K to 450 K. The reaction of Reactant A and Reactant B (typically multiple cycles) results in compounds including: polyamides, polyimides, polyureas, polyurethanes, polythioureas, polyesters, and polyimines. Polyamides can be formed by the reaction of acyl dichlorides and diamines. Polyimides can be formed by the reaction of dianhydrides with diamines or diisocyanates. Polyureas can be made by the reaction of diisocyanato compounds and diamines; for example, a surface (optionally an activated surface) is reacted with a diamine resulting in an amido linkage (—N(R)—) to the surface and a free amide (—N(R)H) group that is reacted with a diisocyanato compound to form a urea linkage (—NH—C(O)—R). Polyesters can be formed by the reaction of a diol and a diacid. Any of these materials may be partly or fully fluorinated at the carbon atoms. In a variant, instead of forming a polyamide, etc., the MLD method allows the synthesis of any desired order of linkages for example, formation of an amido linkage, followed by a urea linkage, followed by a carbamate (urethane) linkage. In the present invention, the reactions are conducted stepwise in the fashion of the MLD process. The lengths of these compounds are much less than typical polymers; and might alternately be termed oligomers.

Inorganic-organic hybrid materials by the reaction of a hydroxyl with an inorganic precursor such as TMA, diethylzinc, zirconium tetrabutoxide, or titanium tetrachloride.

Preferred methods of the present invention comprise: dosing the first reactant into the reaction chamber where the substrate is disposed, purging the reaction chamber with an inert gas or fluid, evacuating the reaction chamber; and repeating these steps for the second (and optionally third or more) reactants, for each cycle. In some preferred embodiments, the conditions are controlled to attain a layer thickness that corresponds to +/−30%, 20%, or 10% or less of the theoretical length of a moiety that makes up a layer (for example a layer "B" in an AB type coating).

Patterning of the coating may be accomplished by patterning after, during or before the application of the coating or during application of the coating. Patterning may be accomplished during the coating process by techniques such as area selective ALD or MLD. Patterning of the coating may also be achieved before coating by patterning the substrate prior to coating with ALD or MLD with techniques that may include nanoindentation, microindentation, masking, lithography, photolithography, or other processes that create nano, micro, and/or macro features on the surface prior to coating. Patterning after deposition of the coating may be achieved by processes including but not limited to etching, nanoindention micro-indentation, lithography, photolithography, or other suitable technique.

EXAMPLES

Contemplated Example 1

MLD of TMA/EG to Create Porous Oxide Coating, Followed by Hydrophobic Surface Treatment with FOMB(DMA)S A glass substrate (3"×6") is heated to 120° C. in a reactor system comprising a chamber, and dosing lines. Trimethyl aluminum [CAS 75-24-1] is kept at room temperature in a vessel connected to the reactor system. Ethylene glycol [CAS 107-21-1] is kept in a sealed container, connected to the reactor system and heated to 100° C. The glass substrate is exposed to alternating gas exposures of trimethyl aluminum and ethylene glycol, depositing a layer, 20 nm thick of an alucone polymer. The coated substrate is then heated under inert atmosphere to 500° C. under air. This results in a porous alumina coating. Less rigorous conditions result in some organic still present. The porous alumina has an extremely high surface area material (over 1000 m$^2$/g).

The substrate is then further exposed to gaseous tridecafluoro-1,1,2,2-(tetrahydrooctyl)methylbis(dimethylamino)silane (FOMB(DMA)S) [CAS 879881-65-9] at 140° C. The FOMB(DMA)S reacts with the surface to provide a hydrophobic coating.

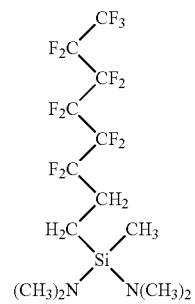

The coated glass slide then exhibits an increase in hydrophobicity as measured by water contact angle measurements. The water contact angle is greater than 100° as opposed to the water contact angle of less than 90° for the untreated glass slide.

Contemplated Example 2

A glass substrate (3"×6") is heated to 160° C. in a reactor system comprising a chamber, and dosing lines. The substrate is exposed to 1 Torr alkoxysilane (N-(2-aminoethyl)-2,2,4-trimethyl-1-aza-2-silacyclopentane [CAS 18246-33-8]) for 2 s. This is followed by 45 alternating exposures of 1 Torr of 1,4 diisocyanobutane [CAS 929-25-9] and 1 Torr of 1H,1H,8H,8H-dodecafluorooctane-1,8-diol [CAS 90177-96-1]. The film is then be terminated with one exposure of 1 Torr of 2,2,3,3,4,4,5,5,6,6,7,7,8,8,8-pentadecafluoro-1-octanol [CAS 307-30-2]. The water contact angle is greater than 115° and the oil contact angle is greater than 100°.

Contemplated Example 3

A glass substrate (3"×6") is heated to 150° C. in a reactor system comprising a chamber, and dosing lines. Trimethyl aluminum is kept at room temperature in a vessel connected to the reactor system. 1H,1H,6H,6H-perfluoro-1,6-hexanediol, [CAS 355-74-8] 98% was kept in a sealed container, connected to the reactor system and heated to 120° C. The glass substrate is exposed to 50 alternating gas exposures of 1 Torr of trimethyl aluminum and 0.5 Torr of 1H,1H,6H,6H-perfluoro-1,6-hexanediol, depositing a layer of the fluorinated alucone polymer. The coated substrate is then exposed once to trimethyl aluminum and once to 2,2,3,3,4,4,5,5,6,6,7,7,8,8, -pentadecafluoro-1-octanol [CAS number 307-30-2]. The water contact angle of this film is greater than 100° C.

Contemplated Example 4

A glass substrate (3"×6") is heated to 160° C. in a reactor system comprising a chamber, and dosing lines. The substrate is exposed to 45 alternating exposures of 1 Torr alkoxysilane (N-(2-aminoethyl)-2,2,4-trimethyl-1-aza-2-silacyclopentane [CAS 18246-33-8]) for 2 s, followed by 1 Torr of 1,4 diisocyanobutane [CAS 929-25-9] and followed by 1 Torr of 1H,1H,8H,8H-dodecafluorooctane-1,8-diol [CAS 90177-96-1]. The film is then be terminated with one exposure of 1 Torr of 2,2,3,3,4,4,5,5,6,6,7,7,8,8,8-pentadecafluoro-1-octanol [CAS 307-30-2]. The water contact angle is greater than 115° and the oil contact angle is greater than 100°.

Contemplated Example 5

In a first step, an alkoxysilane such as N-(2-aminoethyl)-2,2,4-trimethyl-1-azasilacyclopentane is reacted with a surface hydroxyl causing the ring to open. The resulting surface bound entity having a terminal amine group is then reacted with 1,4 diisocyanate. This may optionally be reacted with a diol such as $HOCH_2(CF_2)_8CH_2OH$ to provide a terminal OH functional group. (either for termination or subsequent alternating reaction(s) with TMA and OH-containing moieties, leaving Al—$CH_3$ surface). Finally, the surface species is reacted with a terminating group such as $CF_3(CF_2)_8CH_2OH$.

Contemplated Example 6

A 70 mm×150 mm×0.5 mm glass substrate is coated with 100 cycles of ALD lanthanum oxide at 300° C. in an ALD/MLD system. The coated sample is then heated to 800° C. for 1 hour under an inert environment. The heat-treated, coated sample is then exposed to air under ambient atmospheric conditions for 3 days. The resulting sample is placed back into an ALD/MLD system and further exposed to a hydrophobic capping layer. The resultant sample shows superior hydrophobicity (>115 degrees contact angle) due to the unique combination of a superhydrophobic oxide layer and a fluorinated capping layer.

The optional heat treatment anneals the lanthanum oxide sample. The optional exposure to air converts the as deposited oxide from hydrophilic to hydrophobic (likely due to interactions between the f orbitals in the oxide and physisorbed molecules on the surface.

What is claimed:

1. A hydrophobic coated substrate, comprising: a substrate comprising a hydrophobic surface film wherein the film on the top surface is characterizable by at least two of the following four characteristics: a high shear strength having the best score on a 0 to 5 scale as measured according to ASTM D3359; a water contact angle of at least 110°; at least two different alternating, carbon-based moieties in a chain having a pattern of ABAB; and birefringence or other anisotropic interaction with polarizable light or x-ray diffraction (XRD) that shows higher order structure or x-ray reflectivity (XRR) that shows higher order structure.

2. The hydrophobic coated substrate of claim 1 wherein the film on the top surface is characterizable by: a high shear strength having the best score on a 0 to 5 scale as measured according to ASTM D3359; and a water contact angle of at least 120°.

3. The hydrophobic coated substrate of claim 1 wherein the film on the top surface is characterizable by the presence of alternating, carbon-based moieties in a chain having a pattern of ABAB; and birefringence or other anisotropic interaction with polarizable light or x-ray diffraction (XRD) that shows higher order structure or x-ray reflectivity (XRR) that shows higher order structure.

4. The hydrophobic coated substrate of claim 1 wherein the film on the top surface is characterizable by a high shear strength having the best score on a 0 to 5 scale as measured according to ASTM D3359; a water contact angle of at least 120°; and birefringence or other anisotropic interaction with polarizable light or x-ray diffraction (XRD) that shows higher order structure or x-ray reflectivity (XRR) that shows higher order structure.

5. The hydrophobic coated substrate of claim 1 wherein the film on the top surface is characterizable by a high shear strength having the best score on a 0 to 5 scale as measured according to ASTM D3359; a water contact angle of at least 110°; and at least two different alternating, carbon-based moieties in chain having a pattern of ABAB.

6. The hydrophobic coated substrate of claim 1 wherein the hydrophobic coated substrate is in an outdoor display; portable instrument display, vehicular display, window, lamp cover, sporting equipment, indoor touch display, indoor console display, portable medical display, outdoor CCD camera window, lens, outdoor detector cover glass, or lab instrument panel.

7. The hydrophobic coated substrate of claim 1 wherein the substrate is a powder.

8. The hydrophobic coated substrate of claim 1 further comprising a porous metal layer having a thickness in the range of 1 to 500 nm disposed between the substrate and the film on the top surface.

9. The hydrophobic coated substrate of claim 1 wherein the surface film has a F/H atomic ratio of at least 1.

10. The hydrophobic coated substrate of claim 1 wherein the surface film is characterizable by a XRR spectrum that comprise Kiessig fringes that indicate a super lattice structure.

11. The hydrophobic coated substrate of claim 1 having one or any combination of the following properties: the films comprise less than 10 mass % transition metals in the outer 10 nm of film thickness; visible transmittance of at least 90% at all points in the visible spectrum; water contact angle of at least 100°, a haze of 0.2% or less; a water sliding angle of 15° or less; the entire coating having thickness of 100 nm or less from the substrate surface to the exterior of the terminating layer; with each sublayer having a thickness of at least 0.2 nm and up to 20 nm; an optical clarity of at least 80% over the visible spectrum from 400 nm to 700 nm; a coating thickness in the range of 0.5 nm to 200 nm; a porous layer comprising aluminum oxide disposed between a glass substrate and the hydrophobic layer; wherein the film on the top surface is characterizable by a high shear strength having the best score on a 0 to 5 scale as measured according to ASTM D3359; birefringence or other anisotropic interaction with polarizable light that shows higher order structure or x-ray reflectivity (XRR) that shows higher order structure; at least 5 mass % F in the top (surface) 10 nm of film, and/or having a F/O atomic ratio of at least 2 in the top (surface) 10 nm of film; at least 5 mass % C in the top (surface) 10 nm of film, and/or having a C/O atomic ratio of at least 2 in the top (surface) 10 nm of film; a haze of 5% or less after exposure to 100% humidity in air at standard temperature and pressure; and/or an oleophobicity contact angle (analogous to water contact angle but measured with ethylene glycol) of at least 100°.

12. The hydrophobic coated substrate of claim 1 wherein the film on the top surface is characterizable by a water contact angle of at least 120°.

13. The hydrophobic coated substrate of claim 1 wherein the substrate is a glass plate.

14. The hydrophobic coated substrate of claim 1 comprising a porous layer comprising aluminum oxide disposed between a glass substrate and the hydrophobic layer.

15. The hydrophobic coated substrate of claim 1 further comprising 2 to 100 alternating layers of metal oxide and a hydrocarbon or fluorocarbon moiety disposed on the substrate.

16. The hydrophobic coated substrate of claim 15 wherein the metal oxide comprises Al, Zn, Zr, and Ti, or a combination thereof.

17. The hydrophobic coated substrate of claim 15 further comprising a porous metal oxide layer having a thickness in the range of 1 to 500 nm disposed between the substrate and the 2 to 100 alternating layers of metal oxide and a hydrocarbon or fluorocarbon moiety.

18. The hydrophobic coated substrate of claim 15 wherein the hydrocarbon or fluorocarbon moiety has carbon chain lengths that are substantially perpendicular to the substrate surface.

19. The hydrophobic coated substrate of claim 1 further comprising a fluorinated terminating group.

20. An article having a hydrophobic exterior surface, comprising:
- a substrate comprising a surface comprising a metal oxide or metal nitride;
- a lanthanide oxide layer disposed on the surface; and
- a hydrophobic terminating group disposed over the lanthanide oxide layer and disposed on the exterior of the article.

* * * * *